(12) United States Patent
Atkinson, Jr.

(10) Patent No.: US 7,888,790 B2
(45) Date of Patent: Feb. 15, 2011

(54) BARE DIE PACKAGE WITH DISPLACEMENT CONSTRAINT

(75) Inventor: Robert R Atkinson, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 12/236,314

(22) Filed: Sep. 23, 2008

(65) Prior Publication Data

US 2010/0072612 A1    Mar. 25, 2010

(51) Int. Cl.
   *H01L 23/053*    (2006.01)
(52) U.S. Cl. .................. 257/701; 257/710; 257/707
(58) Field of Classification Search ................. 257/706, 257/707, 704, 701, 710
   See application file for complete search history.

(56) References Cited

U.S. PATENT DOCUMENTS

| | | | | |
|---|---|---|---|---|
| 5,909,056 A | * | 6/1999 | Mertol | .................. 257/704 |
| 5,982,038 A | * | 11/1999 | Toy et al. | .................. 257/772 |
| 5,990,418 A | * | 11/1999 | Bivona et al. | ............... 174/546 |
| 2004/0037059 A1 | * | 2/2004 | Stiborek et al. | ............. 361/764 |
| 2009/0236726 A1 | * | 9/2009 | Retuta et al. | ................ 257/690 |

* cited by examiner

*Primary Examiner*—S. V Clark
(74) *Attorney, Agent, or Firm*—Blakely, Sokoloff, Taylor & Zafman LLP

(57) ABSTRACT

Embodiments of the present invention describe a bare die package and its methods of fabrication. The bare die package comprises a die electrically coupled to a package substrate, and a displacement constraint. In an embodiment of the present invention, the displacement constraint is a plurality of members fixedly attached onto the package substrate and surrounds the die. When the bare die package is secured between a socket and a heat sink, the plurality of members provide structural support to the package substrate and prevent excessive substrate warpage.

16 Claims, 11 Drawing Sheets

BARE DIE PACKAGE WITH DISPLACEMENT CONSTRAINT

BACKGROUND OF THE INVENTION

1. Field of the Invention

The present invention relates to the field of semiconductor packaging and more particularly to a bare die package and its method of fabrication.

2. Discussion of Related Art

Flip chip technology is commonly used in the semiconductor industry for interconnecting a processed die to a package substrate. FIG. 1 illustrates a typical bare die package. The bare die package comprises a processed die 110 electrically coupled to a package substrate 120. Die 110 and package substrate 120 are typically made from different materials, and hence both have different coefficients of thermal expansion (CTE). At the package assembly process, the die 110 does not expand as much as the package substrate 120, thus causing the package substrate 120 to bend away from the die 110 as shown in FIG. 1.

The bare die package can be attached to a socket or printed circuit board (PCB) by various methods such as Pin Grid Array (PGA), Ball Grid Array (BGA) or Land Grid Array (LGA). In LGA compression mount technology (CMT), the bare die package is placed on a socket before a heat sink is disposed on top of the bare die package. FIG. 2 illustrates the different types of force applied onto the package substrate 120 if the bare die package is secured between the socket and heat sink (not shown). Loading force 181 refers to the force applied onto the processed die 110 by the heat sink, and loading force 182 refers to the force applied onto the package substrate 120 by the socket. As a result, the ends of the package substrate 120 bend upward towards the die 110, thereby causing excessive warpage of the package substrate 120 or commonly referred to as substrate warpage.

In one area of LGA technology, an integrated heat spreader (IHS) is formed on top of the die. The IHS not only dissipates some of the heat from the die but also serves as a protective lid for the die. FIG. 3 illustrates a conventional LGA package comprising a IHS 130 attached to the die 110 that is coupled to the package substrate 120. The IHS 130 includes a top plate 131 having sidewalls 132, wherein the sidewalls 132 are attached to the package substrate 120 by a sealant 150. Top plate 131 is coupled to a thermal interface material (TIM) 160 attached to the top of the die 110. As shown in FIG. 3, the IHS 130 provides an additional structural support to the package substrate 120, and also minimizes the effects of substrate warpage.

However, a bare die package does not utilize a IHS. Without a IHS, the bare die package may experience excessive substrate warpage when it is secured between a socket and heat sink. Warpage of the package substrate may result in improper electrical contact between the package substrate and the socket. More significantly, substrate warpage can damage and affect the functionality of the die. One way of minimizing substrate warpage is by placing a compressible gasket between the package substrate and the heat sink, where the compressible gasket surrounds the die. When a heat sink is mounted onto the die, the gasket provides some structural support to the package substrate and minimizes warpage. However, the package substrate is still prone to warpage because the compressible gasket does not provide sufficient structural support to the package substrate.

DETAILED DESCRIPTION OF THE PRESENT INVENTION

A bare die package and its method of fabrication are described. In the following description, numerous specific details are set forth in order to provide a thorough understanding of the present invention. In other instances, well known semiconductor processing techniques and features have not been described in particular detail in order not to unnecessarily obscure the present invention.

Embodiments of the present invention describe a bare die package and its methods of fabrication. The bare die package comprises a die electrically coupled to a package substrate, and a displacement constraint. The displacement constraint provides structural support to the package substrate and prevents excessive substrate warpage when the bare die package is secured between a socket and heat sink. In an embodiment of the present invention, the displacement constraint is a plurality of members that are fixedly attached onto the package substrate, where the plurality of members surrounds the periphery of the die. In another embodiment, the plurality of members are fixedly attached to the planar bottom surface of the heat sink. In an embodiment of the present invention, the displacement constraint is a frame fixedly attached to the planar bottom surface of the heat sink. In another embodiment, the frame is fixedly attached on the package substrate.

Figure 1:
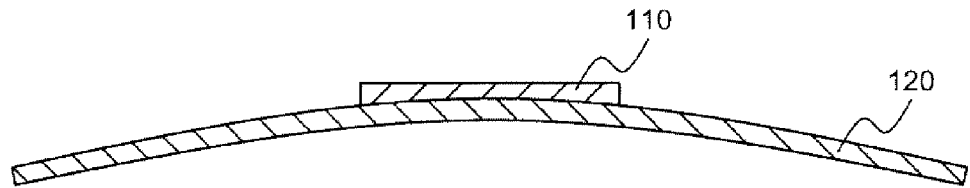
FIG. 1 is a cross-sectional view that illustrates a conventional bare die package.
Figure 2:
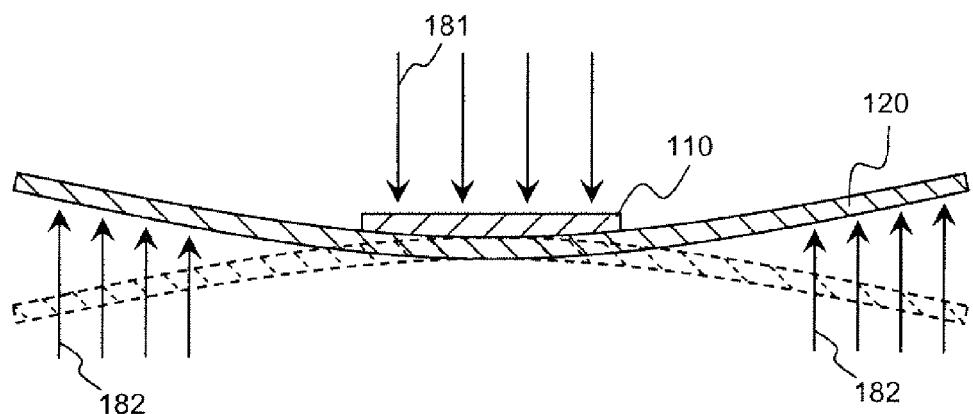
FIG. 2 is a cross-sectional view that illustrates the conventional bare die package of FIG. 1 under loading conditions.
Figure 3:
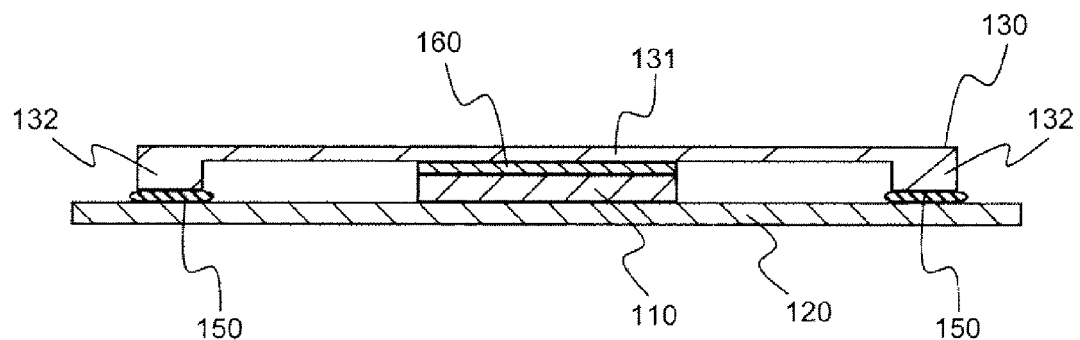
FIG. 3 is a cross-sectional view that illustrates a conventional LGA package comprising an integrated heat spreader.
Figure 4:
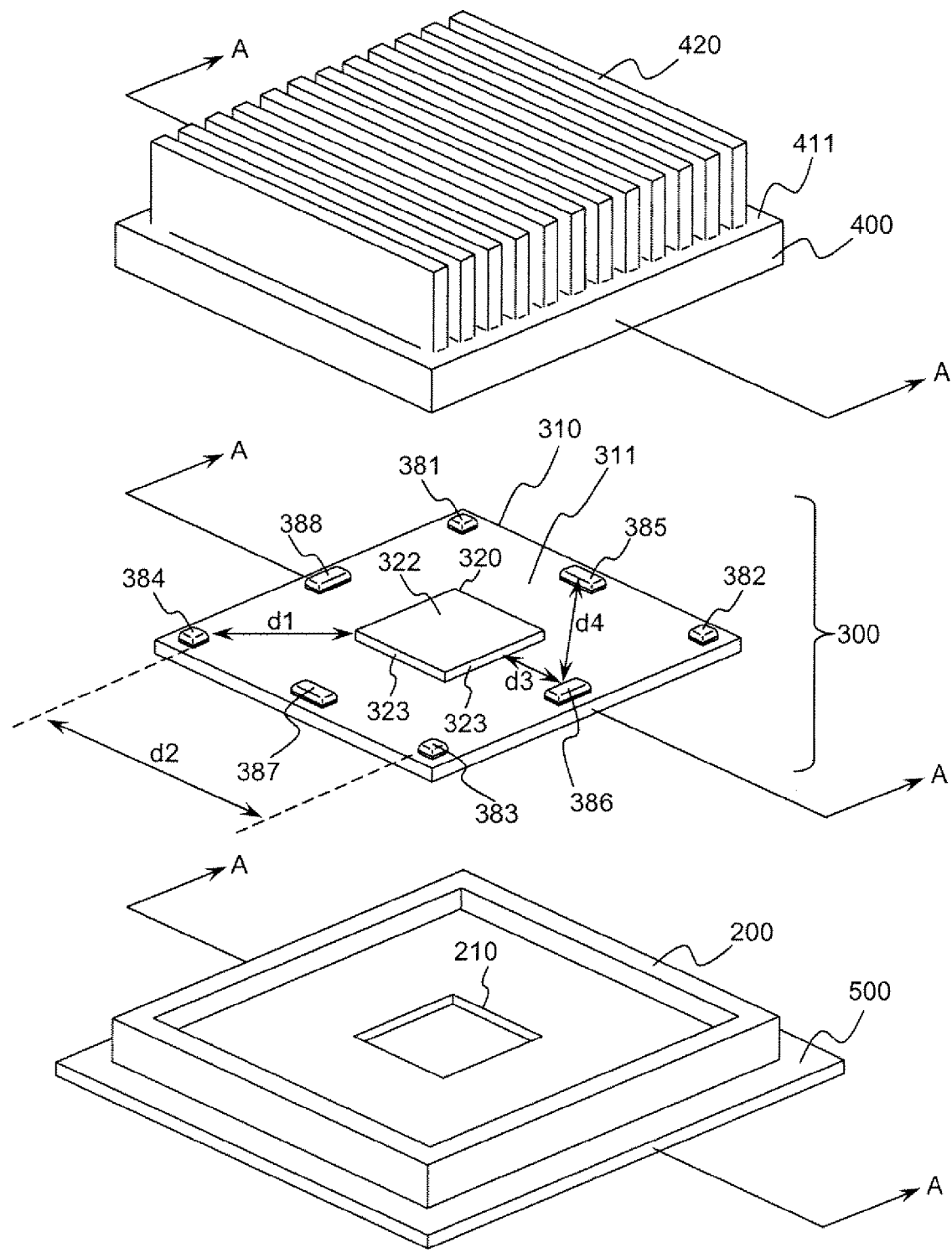
FIG. 4 is a perspective view of a socket assembly in an unassembled configuration in accordance with one embodiment of the present invention.

FIG. 4 illustrates a perspective view of a socket assembly in an unassembled configuration. The socket assembly comprises a socket 200, a bare die package 300, and a heat sink 400. Socket 200 is electrically coupled to a printed circuit board (PCB) 500, and is configured to receive the package 300. The package 300 comprises a package substrate 310 and a processed die 320 electrically coupled to the package substrate 310. In an embodiment of the present invention, a plurality of members 381-388 are fixedly attached to the package substrate 310. Heat sink 400 includes a top surface 411. In one embodiment, top surface 411 have a plurality of fin-shaped members 420 as show in FIG. 4.

Figure 5:
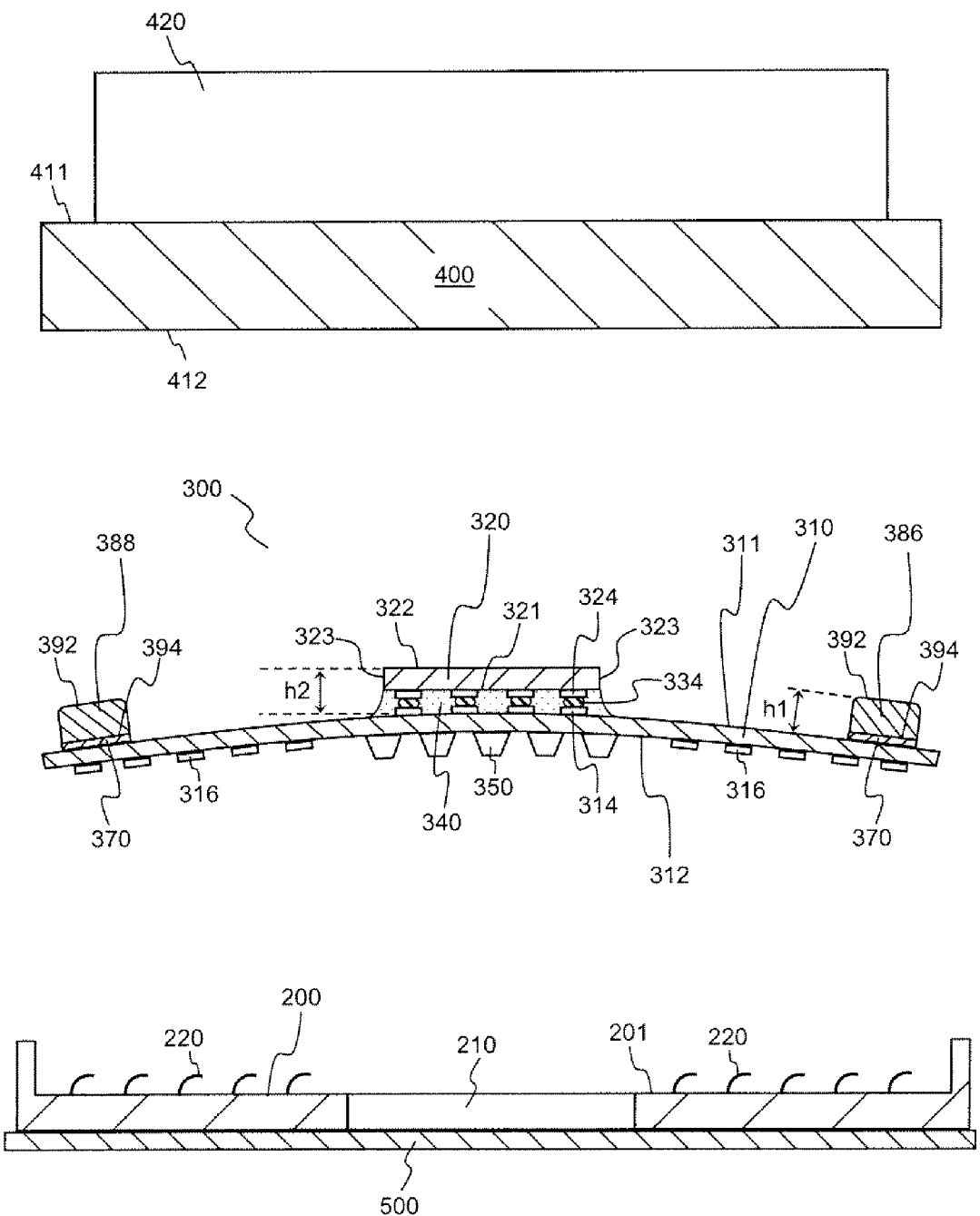
FIG. 5 is a cross-sectional view of the socket assembly in the unassembled configuration as shown in FIG. 4 along lines A-A.

FIG. 5 is a cross-sectional view of the socket assembly of FIG. 4 looking into lines A-A. The package substrate 310 includes a top surface 311 and a bottom surface 312. The package substrate 310 has a slight curvature due to the different coefficients of thermal expansion (CTE) between the package substrate 310 and the die 320, wherein the package substrate 310 expands more than the die 320. In one embodiment, the package substrate 310 can be an organic substrate or a ceramic substrate. A plurality of bond pads 314 are formed on the top surface 311 of the package substrate 310.

In an embodiment of the present invention, the die 320 is a flip chip comprising a front side 321, a back side 322 and a periphery 323 therebetween. Periphery 323 refers to the external side surfaces of the die 320 that extends from the perimeter of front side 321 to the perimeter of back side 322. The front side 321 is electrically coupled to a layer of active devices (not shown) in the die 320. Layer of actives devices refers to components such as transistors, rectifiers, and capacitors that form the integrated circuit in the die 320. In one embodiment, the front side 321 of the die 320 includes a plurality of bond pads 324. Plurality of bond pads 314 on the package substrate 310 are aligned to the plurality of bonds pads 324. The plurality of bond pads 324 are electrically coupled to the plurality of bond pads 314 by contacts 334. In one embodiment, an underfill 340 is deposited between the die 320 and package substrate 310, and particularly, in between the contacts 334.

A plurality of contact pads 316 are formed on the bottom surface 312 of the package substrate 310. Plurality of contact pads 316 are electrically coupled to the plurality of bond pads 314. In one embodiment the plurality of contacts pads 316 are formed adjacent to the perimeter of the bottom surface 312. Furthermore, the plurality of contact pads 316 are aligned to a plurality of spring contacts 220 formed on the top surface 201 of the socket 200. For simplicity purposes, the plurality of spring contacts 220 are not illustrated in FIG. 4. Spring contacts 220 are electrically coupled to the circuitry (not shown) of the PCB 500.

In an embodiment of the present invention, a plurality of capacitors 350 are formed on the bottom surface 312 of the package substrate 310 and below the die 320 as shown in FIG. 5. In one embodiment, the socket 200 includes a centrally located opening 210 as illustrated in FIGS. 4 and 5 to accommodate the plurality of capacitors 350 when the package substrate 310 is placed on the socket 200.

In an embodiment of the present invention, the plurality of members 381-388 are discrete elements fixedly attached to the top surface 311 of the package substrate 310 as shown in FIG. 4. The plurality of members 381-388 are disposed around the periphery 323 of the die 320. In one embodiment, the plurality of members 381-388 are substantially uniformly spaced from each other. In a specific embodiment, the plurality of members 381-388 are disposed adjacent to the perimeter of the top surface 311.

Referring to FIG. 4, members 381, 382, 383, 384 are equidistantly located at a distance d1 from the periphery 323 of the die 320 and at an equal distance d2 from each other. In one embodiment, members 381, 382, 383, 384 are placed in a corner-symmetric pattern, wherein each of them is mounted adjacent to each corner of the package substrate 310. In one embodiment members 385, 386, 387, 388 are equidistantly located at a distance d3 from the periphery 323 of the die 320 and at an equal distance d4 from each other. In one embodiment, each of the members 385, 386, 387, 388 is placed adjacent to the middle of each side of the substrate package 310.

In an embodiment of the present invention, at least four members are fixedly attached to the package substrate 310. For example, only members 381, 382, 383, 384 are attached to the top surface 311 of the package substrate 310. Alternatively, the package substrate 310 may consist of members 385, 386, 387, 388 only.

In one embodiment, the plurality of members 381-388 have a cuboid shape. In a specific embodiment, the members 381, 382, 383, 384 have a square footprint with a length in the range of 1 to 5 mm and a width in the range of 1 to 5 mm. Furthermore, the height of members 381, 382, 383, 384 is about 0.1 to 1.0 mm. In a specific embodiment, the members 385, 386, 387, 388 have a rectangular footprint with a length in the range of 1 to 10 mm and a width in the range of 1 to 5 mm. The height of members 385, 386, 387, 388 is in the range of 0.1 to 1.0 mm. It can be appreciated that the shape of the plurality of members 381-388 is not limited to a cuboid but can be other forms such as a cylindrical shape. The size and dimensions of the plurality of members 381-388 can be adjusted to provide adequate support to the package substrate 310 when the package 300 is secured between the socket 200 and heat sink 400.

FIG. 4 shows the plurality of members 381-388 located adjacent to the perimeter of the top surface 311 of the substrate package 310. However, it can be appreciated that the location of the members is not limited to the perimeter of the substrate package 310 but can be anywhere on the substrate package 310. In one example, members 381, 382, 383, 384 can be placed at half the distance d1 from the periphery 323 of the die 320. In another example, the members 385, 386, 387, 388 can be placed at one-third of the distance d3 from the periphery 323 of the die 320. Distance d1 and distance d2 can be adjusted or controlled to optimize the support which the plurality of members 381-388 provide to the package substrate 310.

The plurality of members 381-388 each has a top surface, and a bottom surface attached to the top surface 311 of the package substrate 310. Each top surface of the plurality of members 381-388 is formed at a height or vertical distance h1 from the top surface 311 of the package substrate 310. Referring to FIG. 5, members 386, 388 each has a top surface 392 formed at height or distance h1 from the top surface 311. In one embodiment of the present invention, the bottom surface 394 of each of the members 386, 388 is fixedly attached to a pad 370 on the top surface 311 of package substrate 310. In another embodiment, the bottom surface 394 of each of the members 386, 388 is directly attached to the top surface 311 of package substrate 310 without any pad 370. The height or distance h2 refers to the vertical distance between the back side 322 of the die 320 and the top surface 311 of the package substrate 310.

In an embodiment of the present invention, the distance h1 of every member 381-388 is substantially equal to the distance h2. In one embodiment, distance h1 is about 1.0 to 5.0 percent smaller or greater than distance h2. For example, the distance h1 of every member 381-388 is about 0.95 mm and the distance h2 is about 1.0 mm. In another embodiment, distance h1 of every member 381-388 is either shorter or longer than the distance h2. In one embodiment, the distance h1 is about 10 to 30 percent shorter or longer than distance h2. For example, the distance h1 is about 1.0 mm and the distance h2 is about 0.8 mm.

In one embodiment of the present invention, the distance h1 of members 381-384 is not equal to members 385-388. In other words, distance h1 of members 381-384 is either shorter or longer than members 385-388. In a specific embodiment, the distance h1 of members 381-384 is about 10 to 30 percent shorter or longer than members 385-388. For example, the members 381-384 have a distance h1 of about 0.7 mm and members 385-388 have a distance h2 of about 0.8 mm.

In one embodiment, the plurality of members 381-388 are made from a material with sufficient rigidity so as to provide structural support to the package substrate 310 when the package 300 is secured between the socket 200 and the heat sink 400. Preferably, the plurality of members 381-388 are made from a rigid, non-compliant material such as metal, metal alloys, ceramics, plastics or solder material. In a specific embodiment, the plurality of members 381-388 are made from copper or silver.

Figure 6:
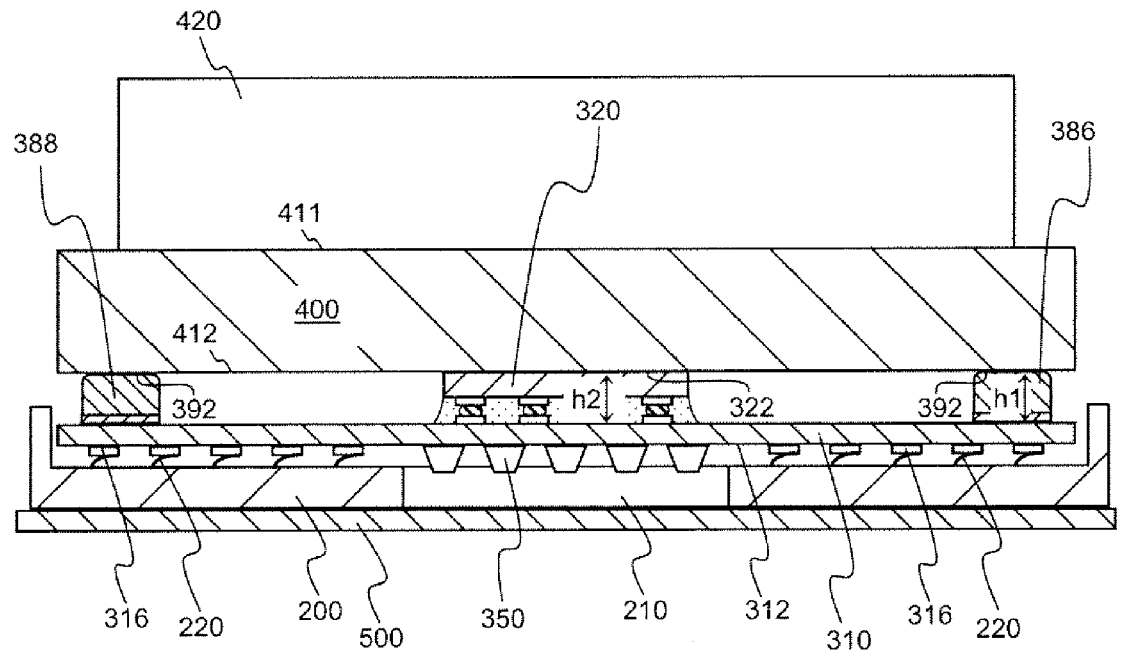
FIG. 6 is a cross-sectional view of a socket assembly in an assembled configuration in accordance with one embodiment of the present invention.

FIG. 6 illustrates an assembled cross-sectional view of the socket assembly, where the package 300 is secured between the socket 200 and he heat sink 400. The socket assembly does not include an integrated heat spreader (IHS) on the package substrate 310. Certain platforms, such as mobile computers and devices, require a compact socket assembly. Therefore, having an IHS that adds an extra thickness (around 1.0 mm) to the socket assembly is undesirable. In one embodiment, a retaining or fastening mechanism is used to secure the package 300 between the socket 200 and the heat sink 400. For simplicity purposes, the retaining or fastening mechanism is not illustrated.

When the package 300 is secured between the socket 200 and the heat sink 400, the bottom surface 312 of the package substrate 310 experiences an upward force applied by the spring contacts 220 of the socket 200 onto the contact pads 316. In addition, the planar bottom surface 412 of the heat sink 400 applies a downward force onto the back side 322 of the die 320 and also onto the top surface 392 of each of the members 381-388. FIG. 6 shows the bottom surface 412 of heat sink 400 disposed on the top surfaces 392 of members 386, 388 and also on the back side 322 of the die 320.

The plurality of members 381-388 act as a displacement constraint or structural support for the package substrate 310 to prevent excessive bending of the package substrate 310 or minimize substrate warpage. By minimizing substrate warpage, damage to the plurality of capacitors 300 is also reduced. In order to provide adequate structural support to the package substrate 310, the plurality of members 381-388 are made from a material with sufficient rigidity and is non-compliant.

In FIG. 6, the distance h1 is substantially equal to the distance h2. In this case, the package substrate 310 is substantially flat when secured between the socket 200 and heat sink 400. However, distance h1 can be adjusted to be shorter or longer than distance h2 so that the package substrate 310 would have a small curvature.

Figure 7:
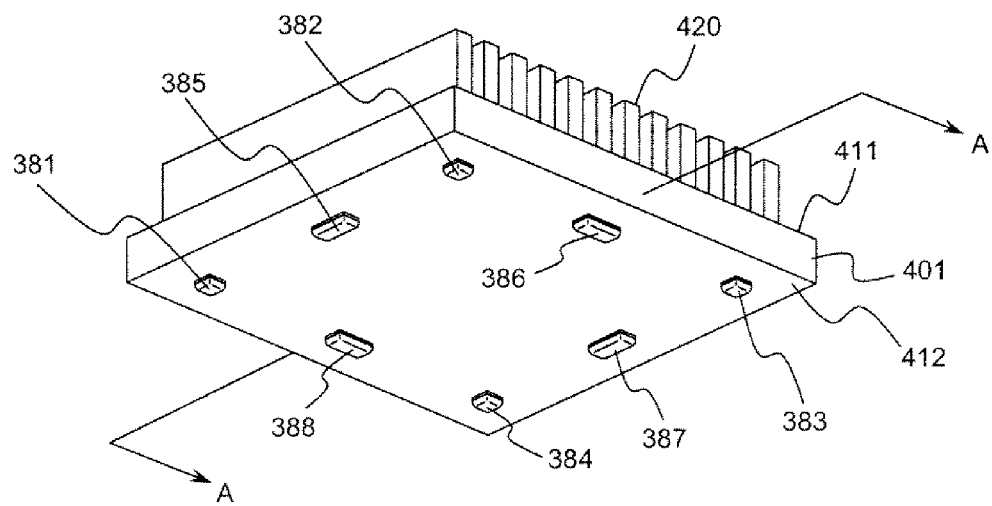
FIG. 7 is a perspective view of a heat sink in accordance with one embodiment of the present invention.

In an alternative embodiment, the plurality of members 381-388 are fixedly attached to the bottom surface 412 of a heat sink 401, as shown in FIG. 7, instead of being attached onto the package substrate 310. In this case, the top surface 392 of each of the plurality of members 381-388 is attached to the bottom surface 412 of the heat sink 401. In one embodiment, the top surface 411 of the heat sink 401 includes the plurality of fin-shaped members 420.

Figure 8:
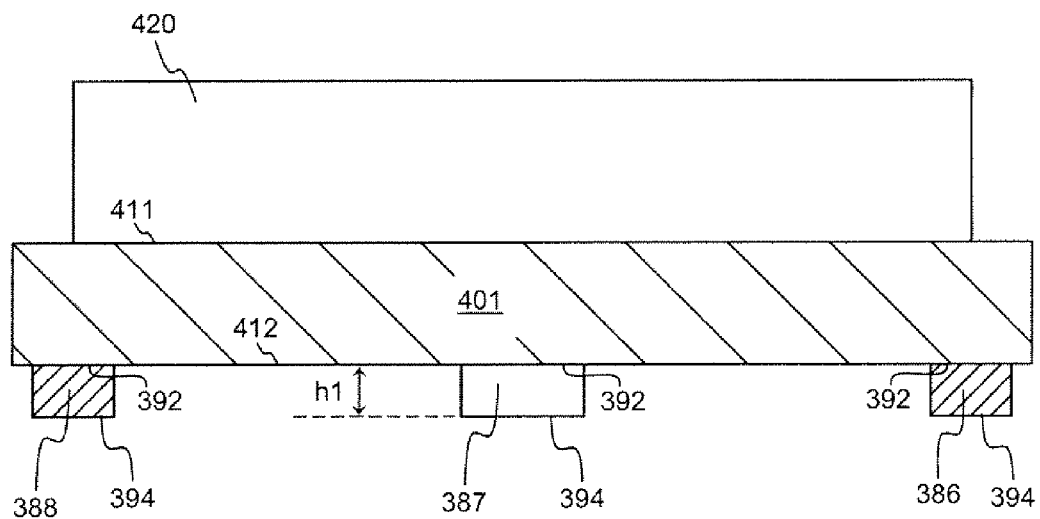
FIG. 8 is a cross-sectional view of a socket assembly in an unassembled configuration with the heat sink of FIG. 7.
Figure 8:
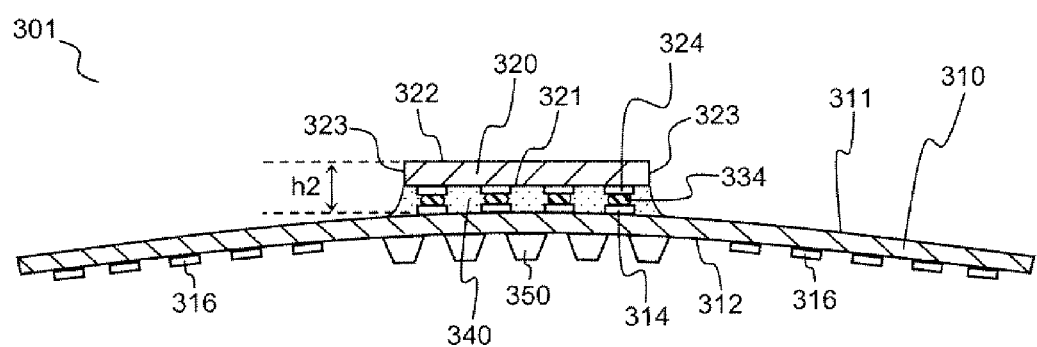
Figure 8:
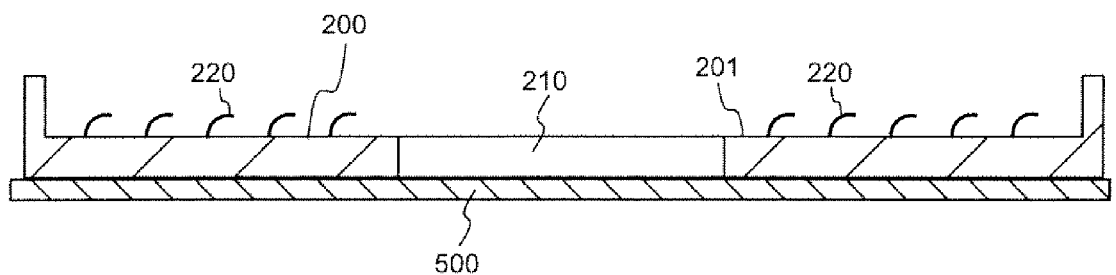

FIG. 8 illustrates a cross-sectional view of the unassembled socket assembly, wherein the members 386, 387, 388 have their top surfaces 392 attached to the planar bottom surface 412 of the heat sink 401. Plurality of members 381-388 are disposed adjacent to the perimeter of the heat sink 401 so that the plurality of members 381-388 surrounds the periphery 323 of the die 320 when the package 301 is secured between the socket 200 and heat sink 401. In FIG. 8, package 301 is similar to the package 300 described in FIG. 5 except that the package 301 does not include the plurality of members 381-388 and pads 370. Socket 200 and PCB 500 in FIG. 8 are similar to earlier described embodiments in FIG. 5, and hence will not be discussed in detail. The socket assembly in FIG. 8 does not include an integrated heat spreader on the package substrate 310

The distance h1 now refers to the vertical distance between each bottom surface 394 of the plurality of members 381-388 and the planar bottom surface 412 of the heat sink 401. Distance h2 still refers t0 the vertical distance between the back side 322 of the die 320 and the top surface 311 of the package substrate 310. In an embodiment of the present invention, the distance h1 of every member 381-388 is substantially equal to the distance h2. In one embodiment, the distance h1 is about 1.0 to 5.0 percent shorter or longer than distance h2. For example, the distance h1 of every member 381-388 is about 0.95 mm and the distance h2 is about 1.0 mm. In another embodiment the distance h1 of every member 381-388 is either shorter or longer than distance h2. In one embodiment, the distance h1 is about 10 to 30 percent shorter or longer than distance h2. For example, the distance h1 is about 1.0 mm and the distance h2 is about 0.8 mm.

In one embodiment of the present invention, the distance h1 of members 381-384 in FIG. 7 is not equal to members 385-388. In other words, distance h1 of members 381-384 is either shorter or longer than members 385-388. In a specific embodiment, the distance h1 of members 381-384 is about 10 to 30 percent shorter or longer than members 385-388. For example, the members 381-384 have a distance h1 of about 0.7 mm and members 385-388 have a distance h2 of about 0.8 mm.

When the package 301 is secured between the heat sink 401 and socket 200, the bottom surface 394 of each of the plurality of members 381-388 is disposed on the top surface 311 of package substrate 310. The socket assembly does not include an integrated heat spreader between the heat sink 401 and package substrate 310. The plurality of members 381-388 act as displacement constraints or structural support for the package substrate 310 to prevent excessive bending of the package substrate 310 or minimize substrate warpage.

In FIGS. 7 and 8, the plurality of members 381-388 are made from a material with sufficient rigidity so as to provide structural support to the package substrate 310 when the package 300 is secured between the socket 200 and the heat sink 401. In one embodiment, the plurality of members 381-388 are made from a rigid, non-compliant material such as metal, metal alloys, ceramics, or plastics. In one embodiment, the plurality of members 381-388 are made from a material that is different to the type of material used by the heat sink 401. For example, the heat sink 401 is made from metal while the plurality of members 381-388 are made from plastics. In one embodiment, the plurality of members 381-388 are fixedly attached to the heat sink 401 by using adhesives, such as but not limited to epoxy.

Figure 9:
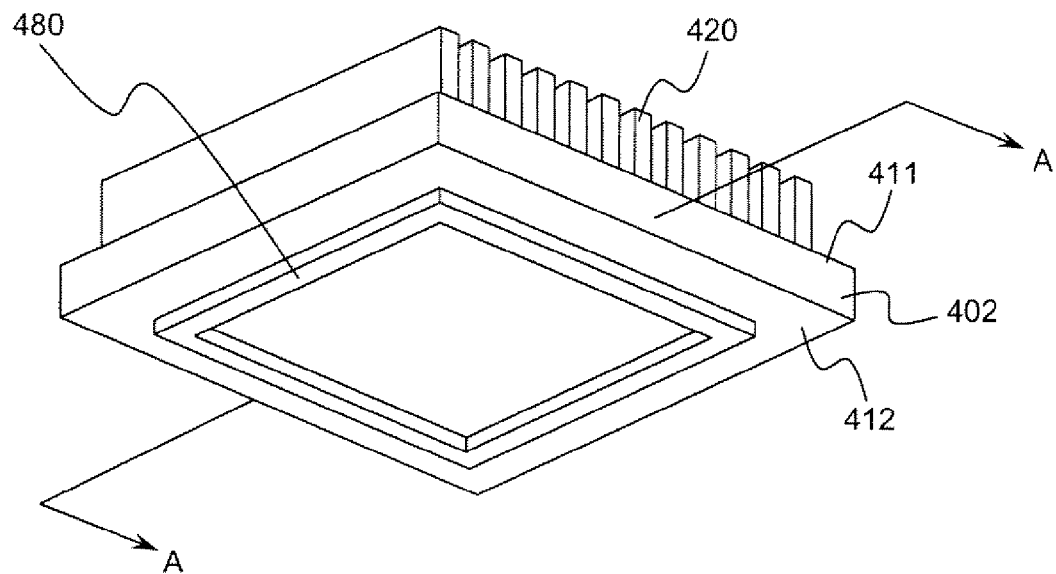
FIG. 9 is a perspective view of a heat sink in accordance with another embodiment of the present invention.

In an embodiment of the present invention, the displacement constraint is a frame 480 fixedly attached to either the heat sink or package substrate. In one embodiment, the frame 480 is fixedly attached to the planar bottom surface 412 of a heat sink 402 as illustrated in FIG. 9. In one embodiment, the top surface 411 of the heat sink 402 includes the plurality of fin-shaped members 420.

Figure 10:
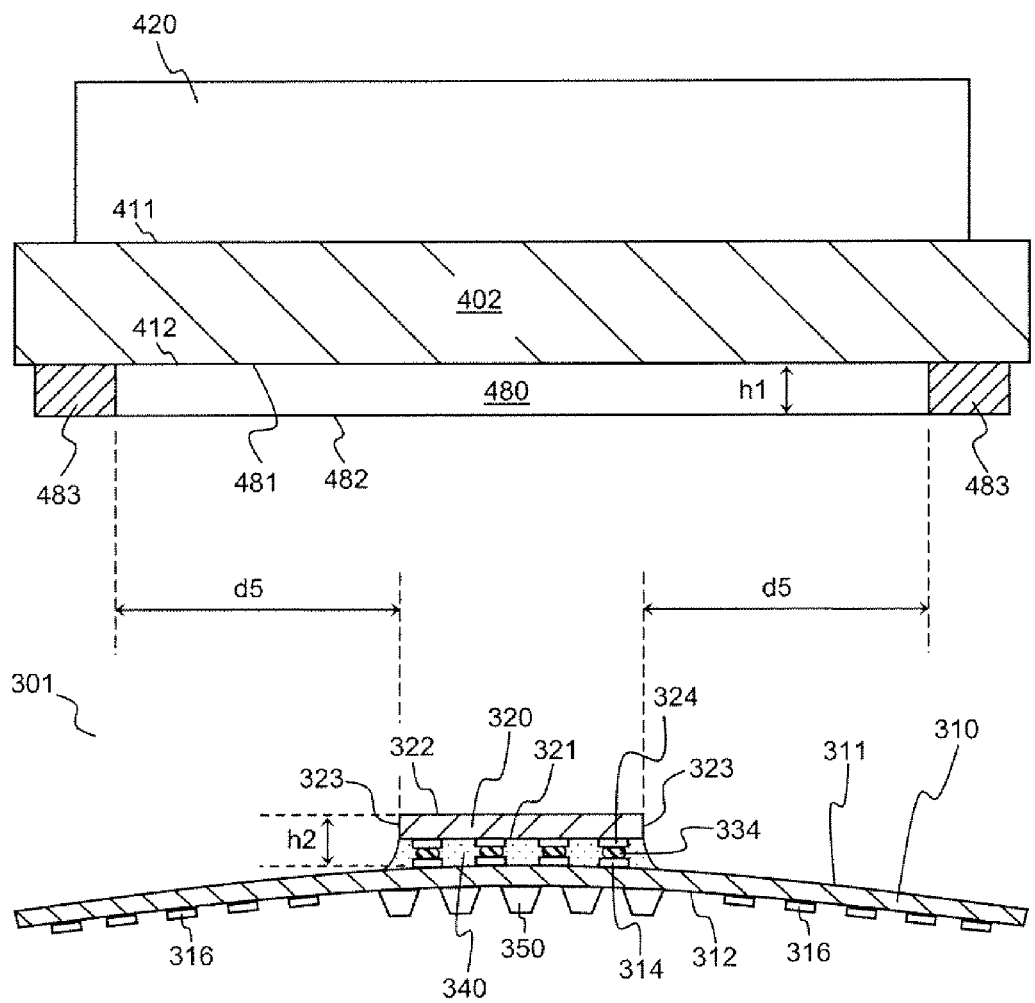
FIG. 10 is a cross-sectional view of a socket assembly in an unassembled configuration with the heat sink of FIG. 9.
Figure 10:
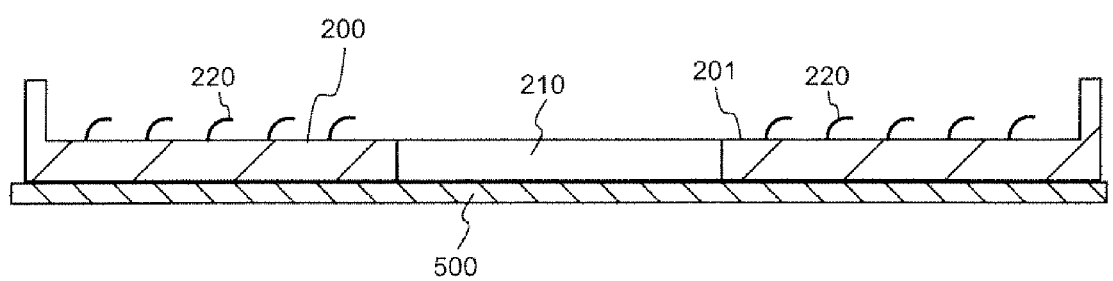

FIG. 10 shows the cross-sectional view of an unassembled socket assembly having the frame 480 on the heat sink 402. Frame 480 includes a top surface 481 and a bottom surface 482, wherein the top surface 481 is fixedly attached to the planar bottom surface 412 of heat sink 402. In one embodiment, bottom surface 482 is a flat planar surface as shown in FIG. 10. In another embodiment, bottom surface 482 is a non-planar surface, such as but not limited to a corrugated surface. The frame further includes sidewalls 483 that extend from the top surface 481 to bottom surface 482. In one embodiment, the width of the sidewalls 483 is in the range of 1.0 to 1.5 mm. In one embodiment, the sidewalls 483 are located at an equal distance d5 from the periphery 323 of the die 320 so that the sidewalls 483 surrounds the periphery 323 of the die 320 when the package 301 is secured between the socket 200 and heat sink 401. In one embodiment, the frame 480 is a single continuous piece that surrounds the periphery 323 of the die 320.

In FIG. 10, package 301 is similar to the package 300 described in FIG. 5 except that the package 301 does not include the plurality of members 381-388 and pads 370. Socket 200 and PCB 500 in FIG. 8 are similar to earlier described embodiments in FIG. 5, and hence will not be discussed in detail. The socket assembly in FIG. 10 does not include an integrated heat spreader on the package substrate 310.

In FIG. 10, the height h1 now refers to the vertical distance between the bottom surface 482 of the frame 480 and the planar bottom surface 412 of the heat sink 402. Distance h2 still refers to the vertical distance between the back side 322 of the die 320 and the top surface 311 of package substrate 310. In one embodiment, the distance h1 is substantially equal to the distance h2. In one embodiment, distance h1 is about 1.0 to 5.0 percent shorter or longer than distance h2. For example, the distance h1 of frame 480 is about 0.98 mm and the distance h2 is about 1.0 mm. In another embodiment, the distance h1 is either shorter or longer than the distance h2. In one embodiment, distance h1 is about 10 to 30 percent shorter or longer than distance h2. For example, the distance h1 is about 1.0 mm and the distance h2 is about 0.8 mm.

In one embodiment, the frame 480 have a square frame-shape as illustrated in FIG. 9. However, the frame 480 can be formed with various types of shapes, such as but not limited to a cylindrical shape. The size and dimensions of the frame 480 can be adjusted to provide adequate support to the package substrate 310 when the package 301 is secured between the socket 200 and heat sink 402.

When the package 301 is secured between the heat sink 402 and socket 200, the bottom surface 482 of frame 480 is disposed on the top surface 311 of package substrate 310. The socket assembly does not include an integrated heat spreader between the heat sink 402 and the package substrate 310. The frame 480 acts as a displacement constraint or structural support for the package substrate 310 to prevent excessive bending of the package substrate 310 or minimize substrate warpage.

Frame 480 is made from a material with sufficient rigidity so as to provide structural support to the package substrate 310 and minimize substrate warpage when the package 301 is secured between the socket 200 and the heat sink 402. In particular, the frame 480 is made from a material that is different to the type of material used by the heat sink 401. For example, the heat sink 402 is made from metal while the frame 480 is made from plastics. In one embodiment, the frame 480 is made from a rigid, non-compliant material such as metal, metal alloys, ceramics, or plastics. In one embodiment, the frame 480 is fixedly attached to the heat sink 402 by a layer of adhesive (not shown), such as but not limited to epoxy.

Figure 11:
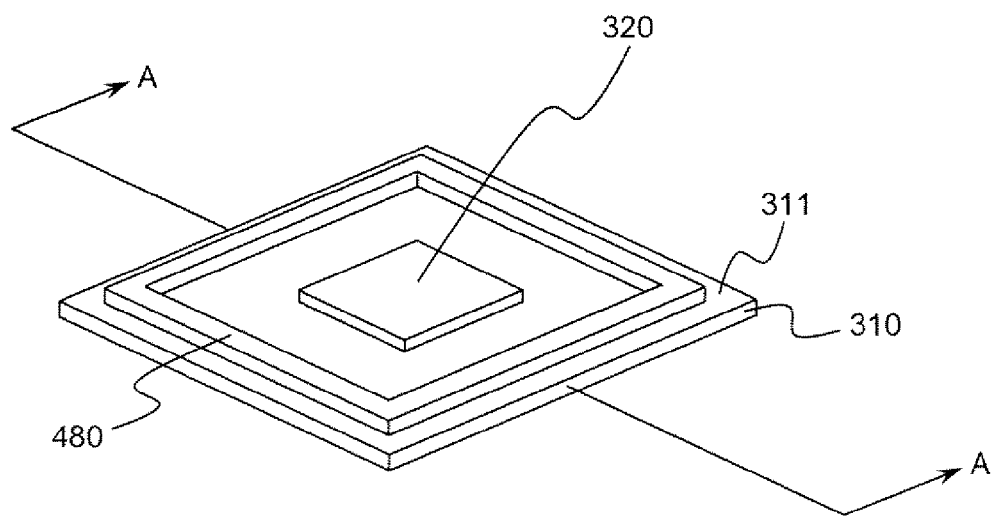
FIG. 11 is a perspective view of a package in accordance with one embodiment of the present invention.
Figure 12:
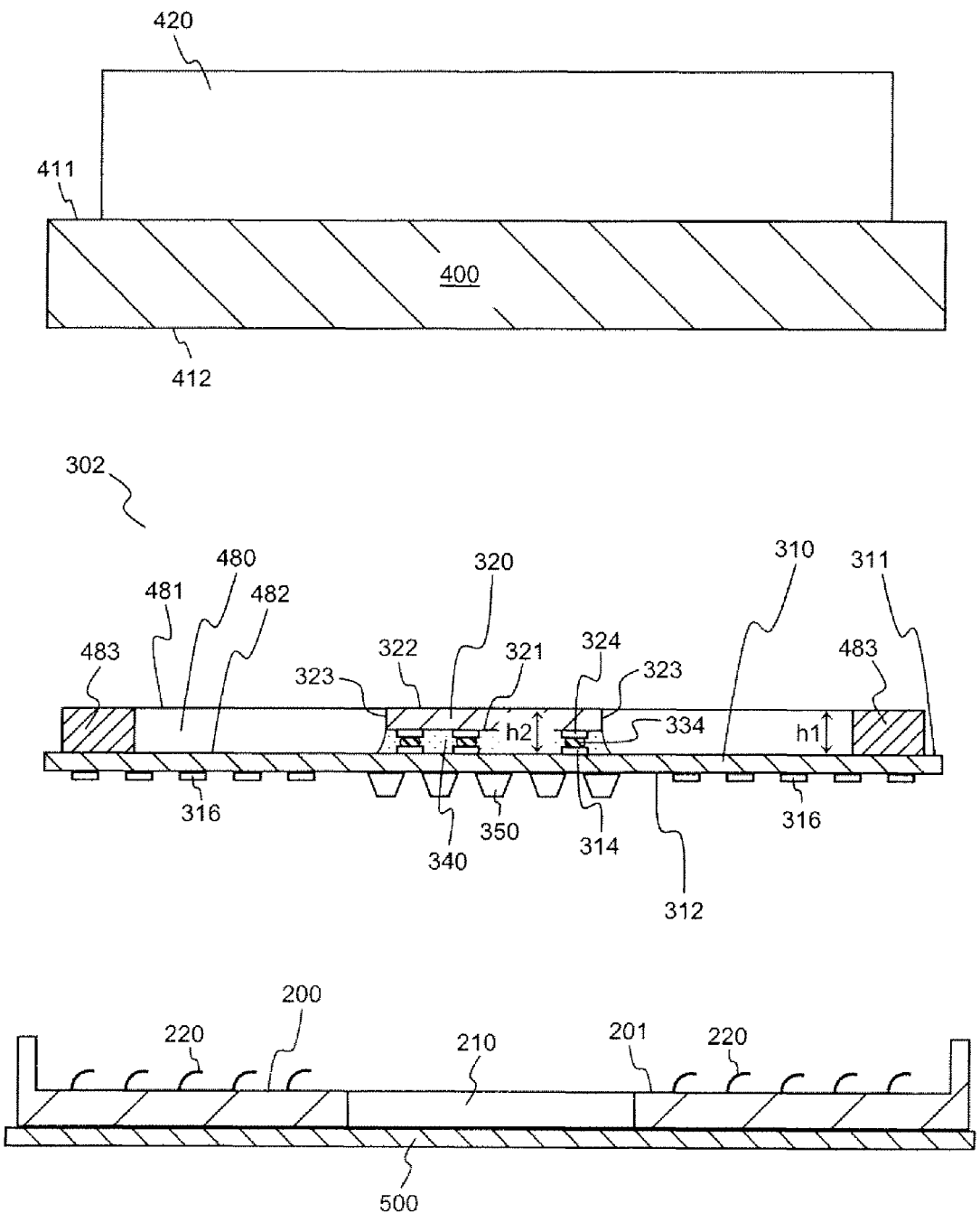
FIG. 12 is a cross-sectional view of a socket assembly in an unassembled configuration with the package of FIG. 11.

In an alternative embodiment, frame 480 is fixedly attached to package substrate 310, as shown in FIG. 11, instead of the plurality of members 381-388. Frame 480 surrounds the periphery 323 of the die 320. FIG. 12 illustrates a cross-sectional view of the unassembled socket assembly, wherein the package 302 is similar to the package 300 described in FIG. 5 except that the package 302 includes the frame 480 instead of the plurality of members 381-388. Socket 200 and PCB 500 in FIG. 12 are similar to earlier described embodiments in FIG. 5, and hence will not be discussed in detail. The socket assembly in FIG. 12 does not include an integrated heat spreader on the package substrate 310. In FIG. 12, the bottom surface 482 of the frame 480 is fixedly attached to the top surface 311 of the package substrate 310. In one embodiment, frame 480 is disposed adjacent to the perimeter of the top surface 311 of the package substrate 310.

In FIG. 12, the height h1 now refers to the vertical distance between top surface 481 of the frame 480 and the top surface 311 of the package substrate 310. Distance h2 still refers to the vertical distance between the back side 322 of the die 320 and the top surface 311 of package substrate 310. In an embodiment of the present invention, the distance h1 is substantially equal to the distance h2. In one embodiment, distance h1 is about 1.0 to 5.0 percent shorter or longer than distance h2. For example, the distance h1 of frame 480 is about 0.98 mm and the distance h2 is about 1.0 mm. In another embodiment, the distance h1 is either shorter or longer than the distance h2. In one embodiment, distance h1 is about 10 to 30 percent shorter or longer than distance h2. For example, the distance h1 is about 1.0 mm and the distance h2 is about 0.8 mm.

When the package 302 is secured between the socket 200 and heat sink 400, the top surface 481 of the frame 480 is disposed on the planar bottom surface 412 of the heat sink 400. The socket assembly does not include an integrated heat spreader between the heat sink 400 and the package substrate 310. The frame 480 acts as a displacement constraint or structural support for the package substrate 310 to prevent excessive bending of the package substrate 310 or minimize substrate warpage.

In FIGS. 11 and 12, the frame 480 is made from a material with sufficient rigidity so as to provide structural support to the package substrate 310 when the package 302 is secured between the socket 200 and the heat sink 401. In one embodiment, the frame 480 is made from a rigid, non-compliant material such as metal, metal alloys, ceramics, or plastics. In one embodiment, the frame 480 is made from a material that is different to the type of material used by the heat sink 400. For example, the heat sink 400 is made from metal while the frame 480 is made from plastics.

Figure 13A:
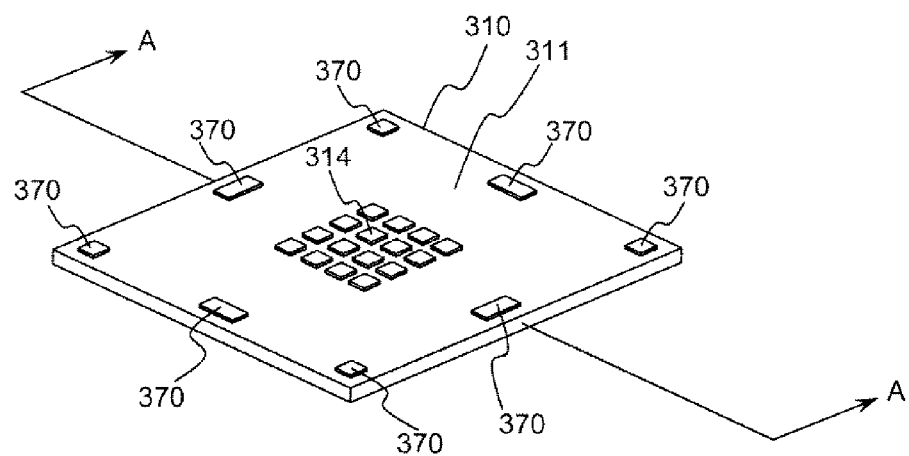
FIGS. 13A, 14A and 15A are perspective views that illustrate a method of forming a package in accordance with one embodiment of the present invention.
Figure 13B:
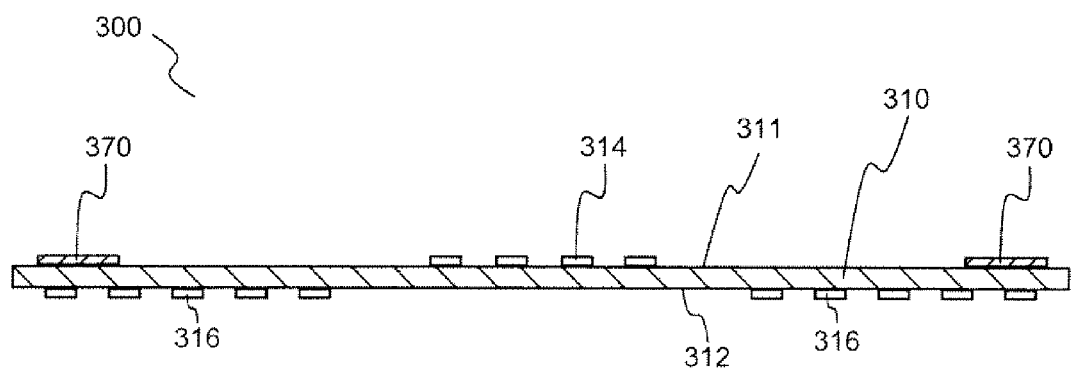
FIGS. 13B, 14B and 15B are cross-sectional views of FIGS. 13A, 14A, 15A respectively along the lines A-A.
Figure 14A:
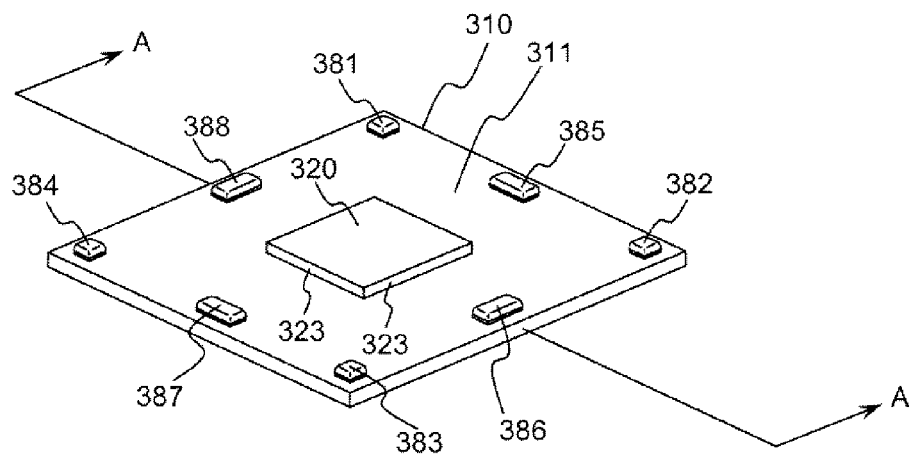
Figure 15A:
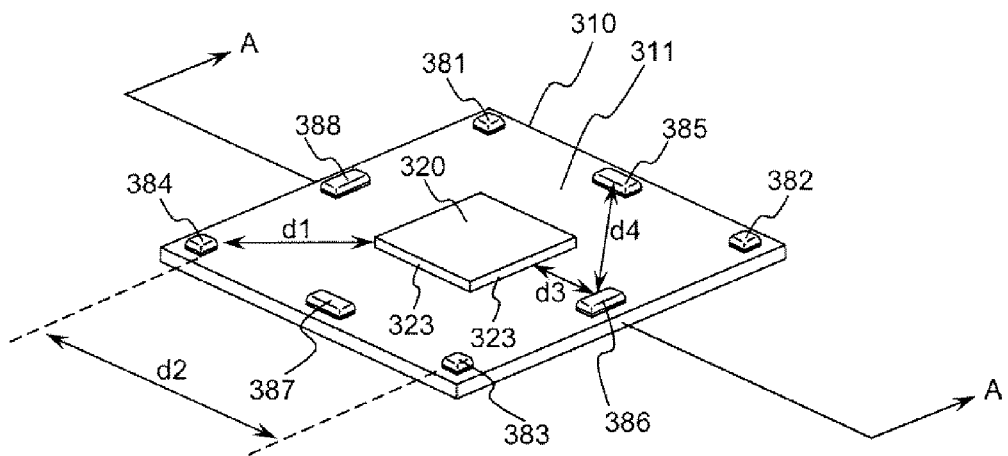

FIGS. 13A, 14A and 15A illustrate a method of forming the package 300 in FIG. 4 in accordance with one embodiment of the present invention. The fabrication of the package 300 begins by providing the package substrate 310 as shown in FIG. 13A. FIG. 13B illustrates the cross-sectional view of the package substrate 310 in FIG. 13A looking into line A-A. In one embodiment, the packages substrate 310 is substantially flat. Package substrate 310 includes top surface 311 and bottom surface 312. In one embodiment, plurality of bond pads 314 are formed on the top surface 311, wherein the plurality of bond pads 314 are aligned to the plurality of bonds pads 324 on die 320 that is subsequently coupled to the package substrate 310. Plurality of bond pads 314 are made from a material, such as but not limited to, metals or metal alloys. The bottom surface 312 of package substrate 310 includes a plurality of contact pads 316, wherein plurality of contact pads 316 are electrically coupled to the plurality of bond pads 314.

A plurality of pads 370 are formed on the top surface 311, wherein the plurality of pads 370 are uniformly spaced from each other around the plurality of bond pads 314 as shown in FIG. 13A. In one embodiment, the plurality of pads 370 are made from a material, such as but not limited to metal, or metal alloys.

In one embodiment, plurality of pads 370 are fabricated at the same time when the plurality of bond pads 314 are formed. In this case, the plurality of pads 370 are made of the same material as the plurality of bond pads 314.

Figure 14B:
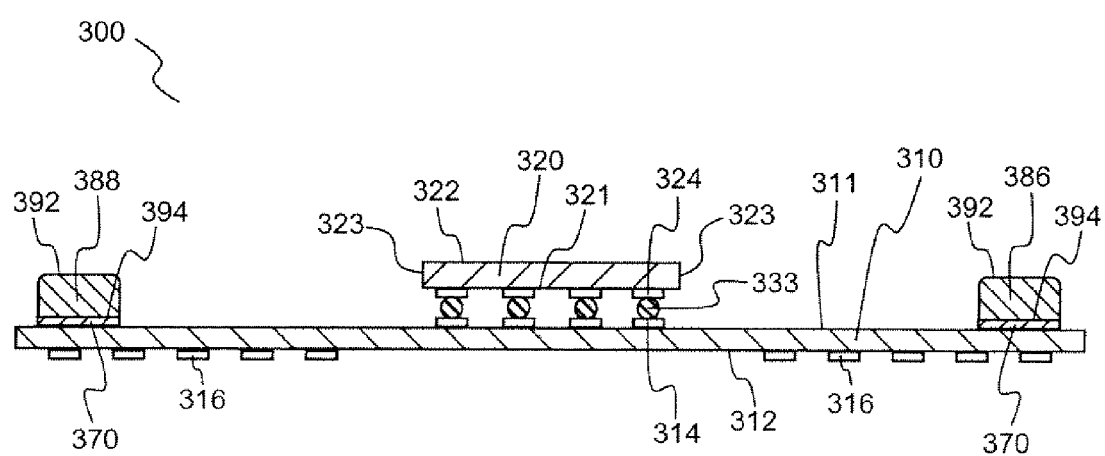

Next, in FIGS. 14A and 14B, the die 320 is disposed on the package substrate 310. In one embodiment, a plurality of solder balls 333 are deposited on the plurality of bond pads 324 on the back side 312 of die 320. Then, the die 320 is "flipped over" and disposed on the package substrate 310 such that the plurality of solder balls 333 are positioned on the plurality of bond pads 314 of the package substrate 320 as shown in FIG. 14B. The die 320 is disposed on the package substrate 310 using well known methods such as a pick and place technique.

Furthermore, the plurality of members 381-388 are disposed on the plurality of pads 370 of package substrate 310. In one embodiment, the plurality of members 381-388 are made of a material that chemically reacts during a heating process and bond to the package substrate 310. For example, the plurality of members 381-388 are discrete solder pre-forms. In a specific embodiment, the solder pre-forms are made from the same solder material as the plurality of solder balls 333, such as but not limited to tin, silver, copper, and their alloys. In another embodiment, the plurality of members 381-388 are made of a material that does not chemically react during a heating process. For example, the plurality of members 381-388 are discrete metal pre-forms.

In one embodiment, the plurality of members 381-388 are disposed on the package substrate 310 using well known methods such as a pick and place technique. The pick and place technique is a commonly used in manufacturing of a package. Hence, using a pick and place technique enables the fabrication of the plurality of members 381-388 to be easily integrated into the package manufacturing.

Figure 15B:
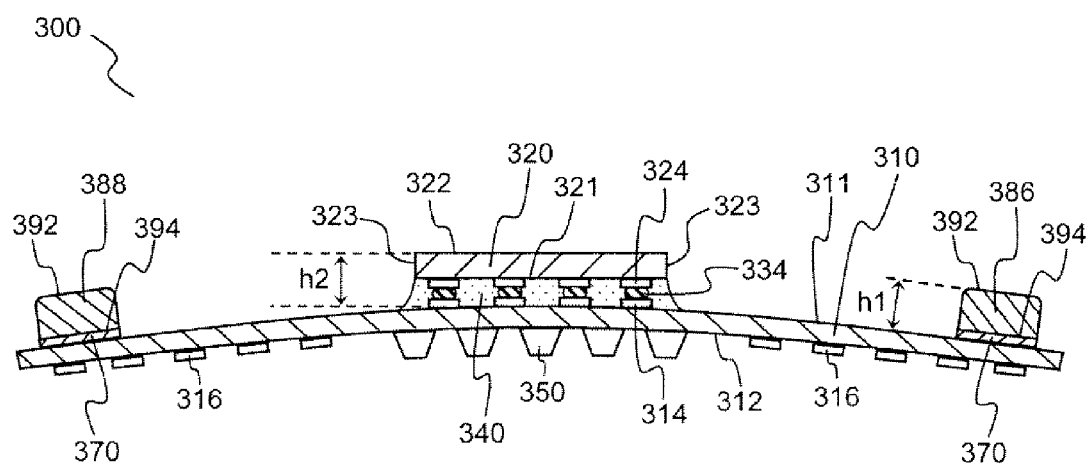

After placing the plurality of members 381-388 onto the plurality of pads 370, the package substrate 310 undergoes a heating process to bond the plurality of members 381-388 to the plurality of pads 370. In an embodiment of the present invention, the heating process is the same reflow process used for melting the plurality of solder balls 333. During a reflow process, the plurality of solder balls 333 are melted to form the plurality of contacts 334 that electrically couples the plurality of bonds pads 324 to the plurality of bond pads 314 as shown in FIG. 15B. In the case where the plurality of members 381-388 are solder pre-forms, the solder pre-forms undergoes an alloying reaction during the reflow process and become bonded or fixedly attached to the plurality of pads 370, wherein the plurality of pads 370 can be copper pads.

In the case where the plurality of members 381-388 are metal pre-forms, the metal pre-forms can be bonded to the package substrate 310 either by an intermediate solder material or adhesive material. In one embodiment, the plurality of pads 370 can be made of solder material that undergoes an alloying reaction during the reflow process to bond the metal pre-forms to the package substrate 310. In another embodiment, the plurality of pads 370 can be made of adhesive material that undergoes a curing reaction during the reflow process to bond the metal pre-forms to the package substrate 310.

As discussed in relation to FIG. 5, the size and dimensions of the plurality of members 381-388 can be adjusted or controlled to provide adequate support to the package substrate 310 when the package 300 is secured between the socket 200 and heat sink 400. In particular, the top surface of each of the plurality of members 381-388 is formed at distance h1 above the top surface 311 of package substrate 310. In one embodiment, distance h1 is substantially equal to distance h2, which is the distance between the back side 322 of the die 320 and the top surface 311 of package substrate 310. In another embodiment, distance h1 is substantially shorter or longer than the distance d2.

During the heating process, the package substrate 310 tends to expand more than the die 320 due to the CTE mismatch between the package substrate 310 and the die 320. As a result, the package substrate 310 changes from a substantially flat substrate to a curved substrate as shown in FIG. 15B.

After the heating process is completed, an underfill is deposited between the die 320 and package substrate 310, and particularly, in between the contacts 334. Furthermore, the plurality of capacitors 350 are formed on the bottom surface 312 of package substrate 310 below the die 320. In one embodiment, the plurality of capacitors 350 can be formed in FIGS. 13A and 13B before the die 320 is attached to the package substrate 310. In one embodiment, the plurality of capacitors 350 are formed on the package substrate 310 using well known method, such as a pick and place technique. This completes the fabrication of the package 300.

After fabrication of the package 300 is complete, the package 300 is placed into a socket assembly. As discussed in relation to FIG. 6, the package 300 is secured between the socket 200 and heat sink 400. Before securing the package 300 between the socket 200 and heat sink 400, the package substrate 310 has a curvature due to the CTE mismatch with the die 320. After securing the package 300 between the socket 200 and heat sink 400, the plurality of members 381-388 act as a displacement constraint or structural support for the package substrate 310 to prevent excessive bending of the package substrate 310 or minimize substrate warpage. The socket assembly does not include an integrated heat spreader between the heat sink 400 and the package substrate 310. In one embodiment, the package substrate 310 is substantially flat when secured between the socket 200 and heat sink 400. In another embodiment, the package substrate 310 can be curved by adjusting distance h1 to be shorter or longer than distance d2. By minimizing substrate warpage, damage to the plurality of capacitors 350 is also reduced.

Several embodiments of the invention have thus been described. However, those ordinarily skilled in the art will recognize that the invention is not limited to the embodiments described, but can be practiced with modification and alteration within the spirit and scope of the appended claims that follow.

I claim:

1. A semiconductor assembly comprising:
 a package substrate having a top surface and a bottom surface;
 a die having a front side, a back side, and a periphery formed therebetween, wherein the front side of the die is electrically coupled to the to surface of the package substrate; and
 a plurality of members disposed around the periphery of the die, wherein each of the plurality of embers includes a to surface and a bottom surface disposed on the top surface of the package substrate, wherein the plurality of members comprises a plurality of first members having a first size and a plurality of second members having a second size, and wherein the bottom surface of each of the plurality of members is fixedly attached to the top surface of the package substrate.

2. The semiconductor assembly of claim 1, wherein the distance between the top surface of each of the plurality of members and the top surface of the package substrate is substantially equal to the distance between the back side of the die and the top surface of the package substrate.

3. The semiconductor assembly of claim 1, wherein the distance between the top surface of each of the plurality of members and the top surface of the package substrate is either shorter or longer than the distance between the back side of the die and the top surface of the package substrate.

4. The semiconductor assembly of claim 1, wherein the plurality of first members are located at a first equidistance from the periphery of the die, and wherein the plurality of first members are substantially uniformly spaced from each other.

5. The semiconductor assembly of claim 4, wherein the plurality of second members are located at a second equidistance from the periphery of the die, and wherein the plurality of second members are substantially uniformly spaced from each other.

6. The semiconductor assembly of claim 5, wherein the distance between the top surface of each of the plurality of first members and the top surface of the package substrate is either shorter or longer than the distance between the top surface of each of the plurality of second members and the top surface of the package substrate.

7. A semiconductor assembly comprising:
a package substrate having a top surface and a bottom surface;
a die having a front side, a back side, and a periphery formed therebetween, wherein the front side of the die is electrically coupled to the top surface of the package substrate;
a plurality of members disposed around the periphery of the die, wherein each of the plurality of members includes a top surface and a bottom surface disposed on the top surface of the package substrate, wherein the plurality of members comprises a plurality of first members having a first size and a plurality of second members having a second size; and
a heat sink having a planar bottom surface disposed on the back side of the die and on the top surface of each of the plurality of members.

8. The semiconductor assembly of claim 7, wherein the top surface of each of the plurality of members is fixedly attached to the planar bottom surface of the heat sink.

9. The semiconductor assembly of claim 8, wherein the distance between the bottom surface of each of the plurality of members and the bottom surface of the heat sink is substantially equal to the distance between the back side of the die and the top surface of the package substrate.

10. The semiconductor assembly of claim 8, wherein the distance between the bottom surface of each of the plurality of members and the bottom surface of the heat sink is either shorter or longer than the distance between the back side of the die and the top surface of the package substrate.

11. The semiconductor assembly of claim 8, wherein the plurality of first members are located at a first equidistance from the periphery of the die, and wherein the plurality of first members are substantially uniformly spaced from each other.

12. The semiconductor assembly of claim 8, wherein the plurality of second members are located at a second equidistance from the periphery of the die, and wherein the plurality of second members are substantially uniformly spaced from each other.

13. The semiconductor assembly of claim 12, wherein the distance between the bottom surface of each of the plurality of first members and the bottom surface of the heat sink is either shorter or longer than the distance between the top surface of each of the plurality of second members and the top surface of the package substrate.

14. The semiconductor assembly of claim 7 further comprising:
a socket electrically coupled on a printed circuit board, wherein the socket is configured to receive the package substrate, and wherein the bottom surface of the package substrate is electrically coupled to the socket.

15. The semiconductor assembly of claim 1, wherein the package substrate does not include an integrated heat spreader.

16. The semiconductor assembly of claim 1, wherein the plurality of members are made from a rigid material selected from the group consisting of metals, metal alloys, ceramics, plastics and solder materials.

* * * * *

UNITED STATES PATENT AND TRADEMARK OFFICE
CERTIFICATE OF CORRECTION

| | |
|---|---|
| PATENT NO. | : 7,888,790 B2 |
| APPLICATION NO. | : 12/236314 |
| DATED | : February 15, 2011 |
| INVENTOR(S) | : Atkinson, Jr. |

Page 1 of 1

It is certified that error appears in the above-identified patent and that said Letters Patent is hereby corrected as shown below:

In column 10, at line 67 delete, "embers" and insert -- members --.

In column 11, at line 1 delete, "to" and insert -- top --.

Signed and Sealed this
Twenty-eighth Day of June, 2011

David J. Kappos
*Director of the United States Patent and Trademark Office*